United States Patent
Goebel et al.

(10) Patent No.: US 8,212,336 B2
(45) Date of Patent: Jul. 3, 2012

(54) FIELD EFFECT TRANSISTOR SOURCE OR DRAIN WITH A MULTI-FACET SURFACE

(75) Inventors: Andreas Goebel, Mountain View, CA (US); Paul A. Clifton, Mountain View, CA (US); Daniel J. Connelly, San Francisco, CA (US); Vaishali Ukirde, San Jose, CA (US)

(73) Assignee: Acorn Technologies, Inc., Santa Monica, CA (US)

( * ) Notice: Subject to any disclaimer, the term of this patent is extended or adjusted under 35 U.S.C. 154(b) by 308 days.

(21) Appl. No.: 12/549,227

(22) Filed: Aug. 27, 2009

(65) Prior Publication Data

US 2010/0065887 A1    Mar. 18, 2010

Related U.S. Application Data

(60) Provisional application No. 61/097,209, filed on Sep. 15, 2008.

(51) Int. Cl.
*H01L 29/04* (2006.01)

(52) U.S. Cl. ... 257/627; 257/628; 257/192; 257/E31.04; 257/E29.003

(58) Field of Classification Search ............ 257/627, 257/628, 192, E31.04, E29.003
See application file for complete search history.

(56) References Cited

U.S. PATENT DOCUMENTS

| | | | | |
|---|---|---|---|---|
| 2005/0285203 | A1* | 12/2005 | Fukutome et al. | 257/368 |
| 2007/0224739 | A1* | 9/2007 | Faulkner et al. | 438/149 |
| 2010/0301394 | A1* | 12/2010 | Shimamune et al. | 257/192 |

* cited by examiner

*Primary Examiner* — Nathan W. Ha
*Assistant Examiner* — Yu-Hsi D Sun
(74) *Attorney, Agent, or Firm* — Tarek N. Fahmi, APC

(57) ABSTRACT

FET configurations in which two (or more) facets are exposed on a surface of a semiconductor channel, the facets being angled with respect to the direction of the channel, allow for conformal deposition of a convex or concave S/D. A convex tip of the S/D enhances electric fields at the interface, reducing the resistance between the S/D and the channel. In contrast, a S/D having a concave tip yields a dual-gate FET that emphasizes reduced short-channel effects rather than electric field enhancement. The use of self-limiting, selective wet etches to expose the facets facilitates process control, control of interface chemistry, and manufacturability.

32 Claims, 8 Drawing Sheets

Pre-etch

Post-etch

Pre-etch

Post-etch

FIELD EFFECT TRANSISTOR SOURCE OR DRAIN WITH A MULTI-FACET SURFACE

RELATED APPLICATION

This application is a NONPROVISIONAL of and claims priority to U.S. Provisional Patent Application No. 61/097,209, filed 15 Sep. 2008, incorporated herein by reference.

FIELD OF THE INVENTION

The present invention relates to field effect transistors (FETs) having a source and/or drain (S/D), wherein a surface of a semiconductor channel proximate to the S/D is formed of two or more well-defined crystallographic surfaces of a common orientation, i.e., belonging to a family of equivalent lattice planes, that meet at an angle such that a surface of the S/D proximate to the semiconductor channel forms an angled feature.

BACKGROUND

Metal S/D FETs promise to improve the scalability, variability, and performance of ultra-thin-body complementary metal oxide semiconductor (CMOS) devices. There are two basic types of metal S/D devices. In the more traditional design, a relatively large Schottky barrier ($\Phi_B$) at the source is used to control the net rate of carrier injection into the channel. While this mode may provide relatively large on-off current ratios, low drain induced barrier lowering (DIBL), and also high sub-threshold slopes, the drive current suffers. See J. Larson and J. Snyder, "Overview and status of metal S/D Schottky barrier MOSFET technology," *IEEE Trans. Electron Devices*, vol. 53, no. 5, pp. 1046-1056, May 2006. The alternative is to minimize the Schottky barrier between the metal and the band corresponding to the channel charge carriers, and use the channel conductance to control current, emulating the operation mode of a doped S/D FET. See D. Connelly, C. Faulkner, and D. E. Grupp, "Performance advantage of metal source/drain in ultra-thin-body silicon-on-insulator and dual-gate CMOS," *IEEE Trans. Electron Devices*, vol. 50, no. 5, pp. 134-1 345, May 2003.

Taking the example of an n-channel FET (n-FET), minimizing ($\Phi_B$) to the conduction band also maximizes $\Phi_B$ to the valence band, which reduces leakage currents under negative gate-to-source bias. See, e.g., D. Connelly, et al., "Ultra-thin-body fully depleted SOI metal source/drain n-MOSFETs and ITRS low-standby-power targets through 2018," in 2005 *IEEE IEDM Tech. Digest*, pp. 972-975, December 2005. Near-zero Schottky barriers may be possible to the valence band of Ge (A. Dimoulas, P. Tsipas, and A. Sotiropoulos, "Fermi-level pinning and charge neutrality level in germanium," *Appl. Phys. Lett.*, vol. 89, p. 252110, 20 Dec. 2006), but in most cases, minimizing the Schottky barrier is a technological challenge. To improve drive current, an electric field enhancement of current across the junction is needed. One such method is to use gate fields by overlapping the source and drain with the gate, e.g., J. Snyder, C. Helms, and Y. Nishi, "Experimental investigations of a PtSi source and drain field emission transistor," *Appl. Phys. Lett.*, vol. 67, p. 1420, 4 Sep. 1995. However, this approach is unfavorable for scaled devices (see D. Connelly, C. Faulkner, and D. E. Grupp, "Optimizing Schottky S/D offset for 25 nm dual-gate CMOS performance," *IEEE Electron Device Lett.*, vol. 24, no. 6, pp. 411-413, June 2003), where carefully optimized S/D-to-gate underlap is preferred. Another approach to increasing the electric field is dopant segregation (see A. Kinoshita et al., "Solution for high-performance Schottky-source/drain MOSFETs: Schottky barrier height engineering with dopant segregation technique," in 2004 *IEEE symposium on VLSI Technology, Tech. Digest*, 15-17 Jun. 2004, pp. 168-169.) Another approach uses the proximity of a low (n-FET) or a high (p-FET) work function metal to induce an inversion layer adjacent to the metal-semiconductor junction and so reduce the resistance of the junction (D. Connelly et al., "Improved short-channel FET performance with virtual extensions," *IEEE Trans. Electron Devices*, vol. 53, no. 1, pp. 146-152, January 2006).

In addition to the S/D-to-gate underlap, the S/D shape can also be optimized, for example by forming a source and drain on {111} facets to create a "trapezoidal body" for a single-gated planar FET to reduce short channel effects. The use of a tetramethylammonium hydroxide (TMAH) solution etch to expose {111} facets and thus form angled sidewalls that slope inward towards the gate was disclosed by Grupp and Connelly in a process to fabricate deposited metal S/D FETs. See FIG. 2 of U.S. Pat. No. 6,833,556, reproduced herein as FIG. 10. Transistor 1000 is formed on a substrate 1002 and contains a channel 1004 that is proximate to a source 1006 and a drain 1008 at single faceted sidewalls 1010 and 1012, respectively. As shown in the detail, the junctions between the S/D and the channel include a separation layer 1014 and a passivation layer 1016. The transistor also includes a gate 1018 surrounded by an insulator 1020. While the single-faceted design may work with a single gate, in dual-gate designs such as FinFETs, it would break the symmetry between the two channels.

Bohr et al., U.S. Pat. No. 7,494,858, describes a transistor 1100 with a tip profile in which the entire S/D region is formed by a single, selective wet etch. As shown in FIG. 11, which is a reproduction of FIG. 2 of the '858 patent, this wet etch forms S/D regions 1102, 1104, with a single facet of the {111} family 1106 and a single facet of the {100} family 1108. That is, the etch leads to two different kinds of crystallographic planes, one from the {010} family and the other from the {111} family. Bohr et al. further elaborate that their inversion layer, i.e., the channel 1110, is aligned only with a single {100} facet in their device. In transistor 1100, a gate 1112 is formed and patterned atop an insulator 1114, and on each side of the gate there is a sidewall spacer 1116.

Luo et al., U.S. Pat. No. 7,485,524, describes a crystallographic etching of S/D regions, but assumes a bulk transistor where the starting wafer is a {110} surface, the S/D region is etched using a wet etch, and the sidewall surfaces are one or more {100} planes in silicon. Subsequent filling of the S/D regions with epitaxially grown semiconductor material results in "slanted" upper surfaces that are far removed from the channel.

Linden et al., U.S. Pat. No. 6,946,350, and Linden et al., U.S. Pat. No. 7,060,576, each describe methods for highly selective faceting of the S/D regions in CMOS devices. However, there is no description of such a device wherein a surface of a semiconductor channel proximate to the S/D is formed of two or more well-defined crystallographic surfaces of common orientation (i.e., surfaces of similar atomic arrangement, of the same crystallographic family) that meet at an angle such that a surface of the S/D proximate to the channel forms an angled feature.

Keating et al., U.S. Pat. No. 7,060,576, describes a transistor structure in which the S/D region is recessed underneath the gate using a wet etch to form a single (111) plane as an S/D-to-channel interface. The recess is subsequently filled with doped SiGe. The structure does not include a S/D-tochannel interface having two or more well-defined crystallographic surfaces of equivalent lattice planes that meet at an angle.

SUMMARY OF THE INVENTION

The present invention involves FET configurations in which two or more facets can be exposed on the semiconductor surface where carriers are injected into the channel (i.e., the source side) or where carriers are extracted from the channel (i.e., the drain side). The angled facets create a concave or a convex surface which, in turn, yields a convex or concave metal S/D shape, respectively, when depositing metal conformally, or a convex or concave semiconductor S/D shape, respectively, when depositing a doped semiconductor conformally.

As an example, the semiconductor can be silicon with a (001) surface, where the channel is oriented along the [110] direction and the surfaces on which the angled facets are formed by etching are (110) and ($\bar{1}$10), so that in this example the facets are of the {111} variety. Applying the concave faceted semiconductor structure to a FinFET together with a deposited metal S/D offers the benefit of a convex pointed metal tip that enhances electric fields at the metal-semiconductor interface, thereby reducing the resistance between the source or drain and the channel. In contrast, an alternate configuration of equivalent lattice planes that forms a convex semiconductor surface and hence a concave metal source and drain can be beneficial for reducing short-channel effects rather than electric field enhancement. This dual-gate FET exhibits a geometry derived from a doubling or mirroring of the single-gate trapezoidal body FET described in U.S. Pat. No. 6,833,556.

In various embodiments, the present invention provides a FET having a metal S/D and a semiconductor channel, wherein a surface of the semiconductor channel region (i.e., the region in which a conductive charge layer may be formed under the gate) proximate to the metal S/D is formed of two or more equivalent lattice planes (e.g., {111} surfaces), the planes meeting at an angle with respect to one another such that a surface of the metal S/D proximate to the semiconductor channel forms an angled feature. The equivalent lattice planes may form a convex feature, meaning that the surface of the metal S/D proximate to the semiconductor channel will form a concave feature, or the equivalent lattice planes may form a concave feature, meaning that the surface of the metal S/D proximate to the semiconductor channel will form a convex feature. Such a convex metal S/D shape may enhance current flow between the S/D and the channel relative to that which would occur in the absence of the angled feature. Alternatively, for short channels a concave metal S/D shape provides a better control of the electrostatics than would be experienced in the absence of the angled feature.

The semiconductor channel proximate the metal S/D may be primarily a single crystal semiconductor, for example silicon (Si). Thus, the well-defined crystallographic surfaces, i.e., the equivalent lattice planes, may be formed, in part, using an etch with a KOH solution, a TMAH solution, a $NH_4OH$ solution, or similar etchant. The metal that makes up the S/D may then be deposited on the well-defined crystallographic surfaces, which form facets in the semiconductor channel. In some cases, a thin passivation layer may be advantageously introduced (e.g., by way of epitaxial growth) between the metal S/D and the semiconductor channel. The atomically flat facets exposed by the etch may advantageously enable the formation of a uniform and controllable passivation layer by allowing for a more precise control of the surface chemistry as compared to a rough surface. In some cases, the channel direction and the S/D interface are selected so that the TMAH or KOH wet etch process substantially stops on the desired {111} facets, i.e., the {111} family of equivalent lattice planes, enabling a precise positioning of the interface. This control derives from the fact that these wet etch processes in particular etch surfaces other than the {111} surface much faster and they therefore self-limit their etch rate, once the etch has exposed the {111} facet.

In various embodiments, the metal that makes up the S/D may be epitaxially aligned with the underlying semiconductor on well defined crystallographic facets. The metal may be a compound of one or more elements ("metallic elements" or "metallic atoms") and of one or more column IV elements ("semiconductor elements" or "semiconductor atoms"); the ratio of semiconductor atoms to metallic atoms being between 1.5:1 and 2.5:1. By way of example, the metallic elements may be one or more of Co, Ni, Ti, W, Mo, Ta, Pt, Ir, Pd, Ru, Hf, Y, or the rare earth elements. Further, in some cases, a passivation layer epitaxially aligned with underlying semiconductor is interposed between the metal and the semiconductor.

Other semiconductor channel materials may be used, perhaps forming facets using different etches on different crystallographic surfaces. The semiconductor may be another elemental semiconductor such as germanium (Ge), or an alloy of group IV elements such as SiGe, or it may be a compound semiconductor, such as a III-V semiconductor, for example GaAs or an alloy of GaAs. In the latter case, facets may be formed by "dry" etching with a halogen plasma, for example a gas plasma containing chlorine, bromine or iodine, to form facets of the {110} family of equivalent lattice planes (see U.S. Pat. No. 4,397,711, to Donnelly et al.). For example, a source or drain may be formed primarily with (101) and (10$\bar{1}$) facets where a channel is parallel to a (001) surface and where current generally flows along the [100] direction. An opposing drain or source may then be formed primarily with ($\bar{1}$01) and ($\bar{1}$0$\bar{1}$) facets.

In some cases, the FET may be a thin-body FET, in which semiconductor material is present proximate to the semiconductor channel, but not at boundaries of the metal S/D that are not proximate to the semiconductor channel. In various instances of such a thin-body FET, the thickness of the semiconductor may be less than its width. An example may be a silicon FET, where a thickness direction is along a [001] crystallographic direction, a width direction is along a [1$\bar{1}$0] crystallographic direction, and a direction between a source and drain perpendicular to the width direction and perpendicular to the thickness direction is a [110] crystallographic direction. Or, the thickness direction may be along a [001] crystallographic direction, the width direction along a [100] crystallographic direction, and a direction between a source and drain perpendicular to the width direction and perpendicular to the thickness direction a [010] crystallographic direction. Alternatively, the thickness direction may be along a [110] crystallographic direction, the width direction of the channel along a [1$\bar{1}$0] crystallographic direction, and a direction between a source and drain perpendicular to the width direction and perpendicular to the thickness direction a [001] crystallographic direction. Or, the thickness direction may be along a [110] crystallographic direction, the width direction along a [001] crystallographic direction, and a direction between a source and drain perpendicular to the width direction and perpendicular to the thickness direction a [1$\bar{1}$0] crystallographic direction.

In some instances relative control of the potential of the semiconductor channel by a gate of the FET will be greater than would be provided in the absence of the angled features. Further, where the well-defined crystallographic surfaces are formed by an etch, a relative position of an edge of the metal S/D proximate to the semiconductor channel and the gate is often better controlled than it would be in the absence of the etch. The advantage of controlling the source or drain shape and position applies in general to any deposited source or drain. With a deposited source or drain, a conducting material is deposited with the interface between the deposited conductor and the underlying semiconductor determining the edge of the source or drain. This deposited conductor could be a metal or a doped semiconductor. In either case, the present dual-faceted structure may uniquely enable control of the edge of the source or drain, and may relatively minimize undesired electrostatic coupling between a source or drain and a channel.

Above, it was noted that enhanced electric fields are of benefit to metal S/D FETs. Enhanced electric fields may also be of benefit to a doped source or drain FET, in particular if the semiconductors comprising the junction are of a different type, presenting a difference across the junction in either the conduction band or valence band structure. Such a junction, typically called a "heterojunction" (in contrast to a "homojunction" in which the semiconductor material is more similar across the junction), may provide carriers, either electrons or holes, crossing the junction with a Schottky barrier analogous to that typically found with metal-semiconductor junctions. In such a case, the benefit in enhanced tunneling and/or thermionic field emission provided to a metal-semiconductor junction is further provided to the semiconductor heterojunction.

Accordingly, some embodiments of the invention provide a FET having a S/D and a semiconductor channel, wherein a surface of the semiconductor forming the interface between the STD and the channel is formed of two or more well-defined crystallographic facets of a same family of equivalent lattice planes, the facets meeting at an angle with respect to one another such that a surface of the S/D proximate to the semiconductor channel forms an angled feature and a line segment, said angled feature and line segment being proximate a location of an inversion layer in the channel, wherein the S/D comprises a doped semiconductor S/D, and wherein the channel and the S/D are the same semiconductor of different doping, the semiconductor comprising the S/D having an average atomic fraction of dopant atoms at least ten times as great as an average fraction of dopant atoms in the semiconductor comprising the channel. The S/D may comprise a doped semiconductor S/D and the channel and the S/D may be of a chemically different semiconductor, forming a heterojunction.

Still a further embodiment provides that following formation of a gate and spacer stack for a transistor, S/D region(s) of the transistor are etched using a directional reactive ion plasma etch; an insulating layer is formed at a bottom of the S/D region(s); and a sidewall of the S/D region(s) that is/are adjacent to a channel region of the transistor is/are etched to form two or more well-defined crystallographic facets of the same orientation on the sidewall, the facets meeting at an angle with respect to one another such that the S/D region proximate to the channel region extends to form an angled feature and a line segment, the angled feature and line segment being proximate a location of an inversion layer in the channel.

These and other features of the present invention are discussed in greater detail below.

BRIEF DESCRIPTION OF THE DRAWINGS

The present invention is illustrated by way of example, and not limitation, in the figures of the accompanying drawings, in which.

DETAILED DESCRIPTION

Figure 1A:
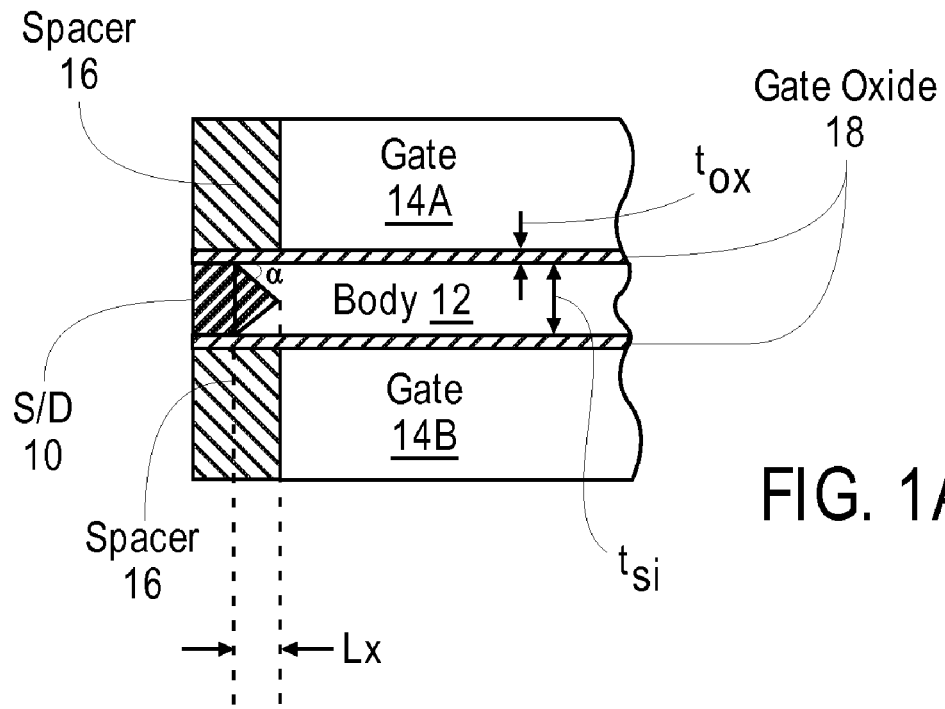
FIGS. 1A and 1B illustrate, respectively, a dual gate device having a convex/concave S/D.

Described herein are devices in which the interface between a semiconductor channel and a source/drain (S/D) in the vicinity of the inversion layer is characterized by being made of more than one facet of a family of equivalent lattice planes. The S/D material can be made of a semiconducting material or of a metal. In both cases, the interface can have a thin passivation layer. Although such devices will be discussed with reference to certain illustrated examples thereof, the present invention is not intended to be limited through presentation of these examples. Instead, the invention is defined in the claims following this description and the examples presented herein are intended only to help illustrate features of the invention in a non-limiting fashion. We start by describing a FET where the S/D material is a metal.

Metal S/D FETs in which a surface of a semiconductor channel proximate to the metal S/D is formed of two or more of a family of equivalent lattice planes that meet at an angle such that a surface of the metal S/D proximate to the semiconductor channel forms an angled feature are examples of devices configured in accordance with the present invention. Preferably, the line segment along (or point at) which the angled facets meet is aligned with the proximate location of the channel inversion layer.

In the context of the present discussion, a metal source is a source in which electrons or holes for conduction in a channel are provided directly from a metal to the semiconductor channel, possibly through a thin intermediate layer (for example a passivation layer). Similarly, a metal drain receives electrons or holes directly from a channel, possibly through a thin intermediate layer. In contrast, in the case of a doped semiconductor source or drain, electrons or holes are provided from or received by a doped semiconductor region, even if there may be metal in contact with the doped semiconductor some distance away from the channel. That is to say, with a doped semiconductor source or drain, carriers may be exchanged between the doped semiconductor source or drain and a metal, and in turn carriers may be exchanged between the doped semiconductor source or drain and the channel, but these may be different carriers. With a metal source or drain, carriers are exchanged directly between the metal and the channel. A metal source or drain may be considered a contact to a channel, whereas metal within a doped source or drain may be considered a contact to the source or drain, where the source or drain is contacting the channel.

Further, with a metal source or drain there may be dopants in the vicinity of the metal, even in a high concentration. For example, it has been found that dopant segregation into Si from a metal, for example NiSi or PtSi, may be used to enhance the electric field at the surface of a metal source. However, as long as the dopant layer is sufficiently thin that the carriers generally pass between the channel to the metal without scattering or recombining, for example if the extent of the high doping adjacent to the metal is no more than 5 nm, then for the purposes of this application the source or drain may still be considered a metal source or drain. An indication of a metal source or drain versus a doped source or drain with a metal contacting the source or drain would be that a doped region immediately proximate to the interface is fully depleted, or in other words that the charge due to the bound and ionized impurities is substantially greater than the free carriers of the opposite charge.

When a metal is placed in contact with a semiconductor, possibly with the presence of a thin interfacial layer between the two, it is generally energetically favorable for free carriers (for example, occupying electronic states which behave as electrons or holes in the semiconductor) to exist in the metal rather than in the semiconductor. The associated (potential) energy difference is described as a Schottky barrier between the metal and the semiconductor. However, if there is a sufficient electric field at the interface, while it may be energetically unfavorable for a free carrier to exist immediately adjacent to the interface, further from the interface it may be energetically favorable for the free carrier to exist in the semiconductor. Charge may travel from the metal to locations in the semiconductor that are not immediately proximate to the interface by the process of quantum mechanical tunneling. The larger the electric field, the less distance which a carrier must tunnel to reach a location where its presence is energetically favored, and the more likely this tunneling is to occur. It can therefore be advantageous to increase the electric field at a metal-semiconductor interface, in particular a metal-semiconductor interface forming the source of a FET.

Proximate to a metal surface, for a given potential difference between the metal surface and some remote reference surface (for example a semiconductor channel, or gate electrode, or drain, or substrate), there will be an electric field. In the region of interest, that electric field will be larger if the metal surface (source or drain) is convex rather than planar or concave. Thus, if a metal source of a FET is formed with a convex surface, as opposed to a concave or planar surface, the convex aspect can provide for an increase in the electric field, and as a result an increased probability of carriers tunneling between the metal and a semiconductor channel, and therefore an increase in the current which flows through the channel. A greater current through a channel generally results in superior circuit performance, for example by faster switching of logic states, or by amplification of signals of greater frequency.

Similarly, when two semiconductors of differing structure or composition are placed in contact, it is typically energetically favorable for an electron or hole to exist in one versus the other due to differences in conduction band or valence band structure. For example, if a source or drain material is used with a higher-energy valence band maximum than the valence band maximum of the semiconductor forming a channel region, there will exist a potential barrier for holes to pass from the source or drain into the channel. Analogous to the case of a metal source or drain, the hole may pass between the source or drain and the channel by means of quantum mechanical tunneling. This tunneling will be facilitated with a sufficiently high electric field proximate to the interface, and this electric field can be enhanced by the presence of a convex tip of the source or drain formed by multiple crystallographic facets.

With the above in mind, then in accordance with embodiments of the invention a channel in a semiconductor FET may be formed in a semiconductor which is primarily a single crystal, a semiconductor formed of multiple crystals of different orientation (a polycrystalline semiconductor), or a semiconductor formed without long-range order (an amorphous semiconductor). If the semiconductor is primarily single-crystal, various processes may be used to form surfaces with preferred crystallographic orientation (by "orientation", we mean surfaces of similar atomic arrangement, of the same crystallographic family, for example, (111) and (11$\bar{1}$) are of the same family of equivalent lattice planes and, therefore, are considered to be of the same orientation). For example, etches of Si in solutions of tetramethylammonium hydroxide (TMAH) or potassium hydroxide (KOH) may tend to form {111} surfaces. Multiple {111} surfaces may be exposed with a single etch, where different {111} surfaces intersect at an angle.

Figures 2A, 2B:
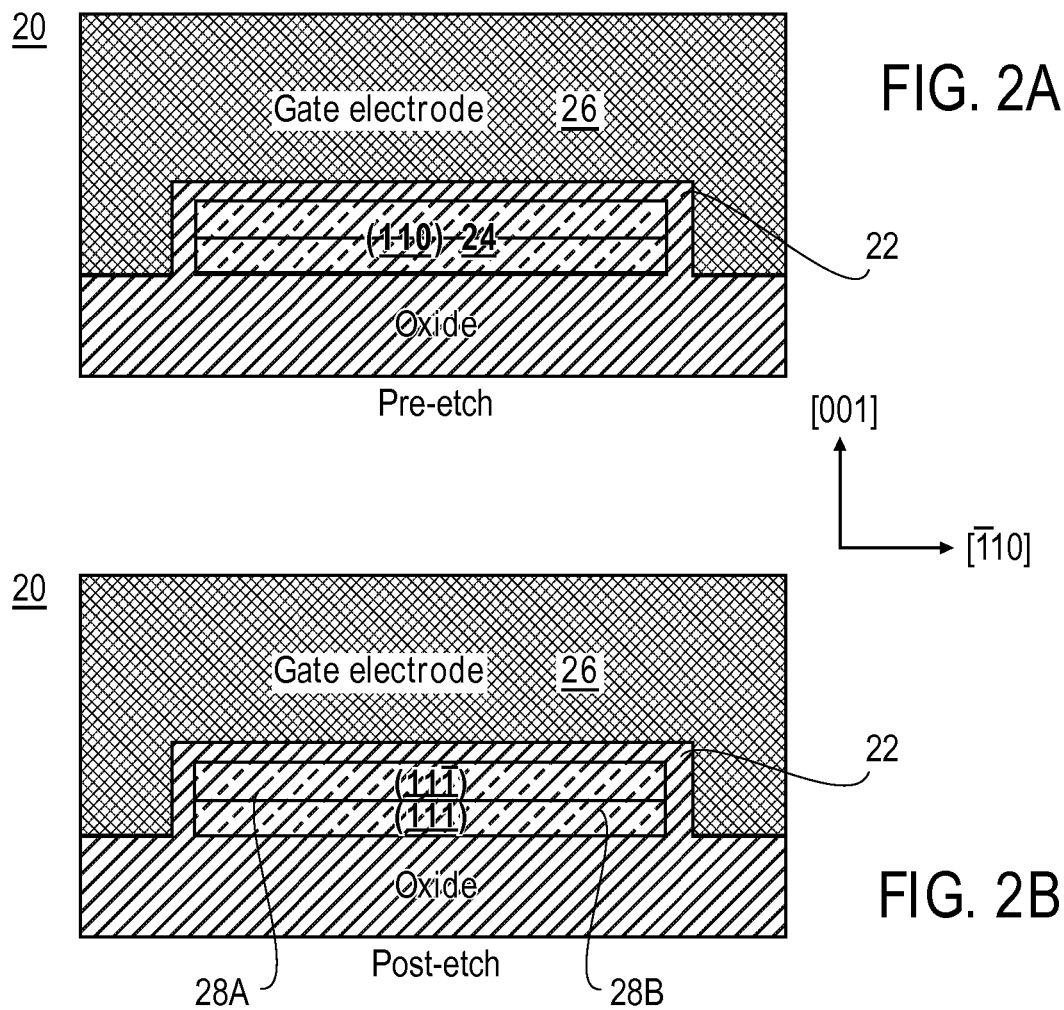
FIGS. 2A and 2B illustrate a further example of the present invention in the context of a thin-body, silicon-on-insulator (SOI) FET as seen end-on from the source end of the device.

By way of example, given a starting (110) surface exposed at an end of a semiconductor channel, as illustrated in FIG. 2(a) an etch may expose (111) and (11$\bar{1}$) facets, both members of the same family of equivalent lattice planes, on said surface as depicted in FIG. 2(b). The intersection of these facets forms an angle with a tangent equal to $1/\sqrt{2}$, forming a concave feature on the semiconductor surface with a notch, line of atomic dimensions. Subsequently depositing a metal (e.g., for a S/D) onto the semiconductor facets forms a convex metal feature at this intersection. More generally, if the facets form a concave feature in the semiconductor, the metal will form a convex feature. If the semiconductor facets form a convex feature, the metal will form a concave feature. For a metal source, a convex metal feature is advantageous for an increased electric field and as a result an increase in the current that flows through the channel.

Figure 3A:
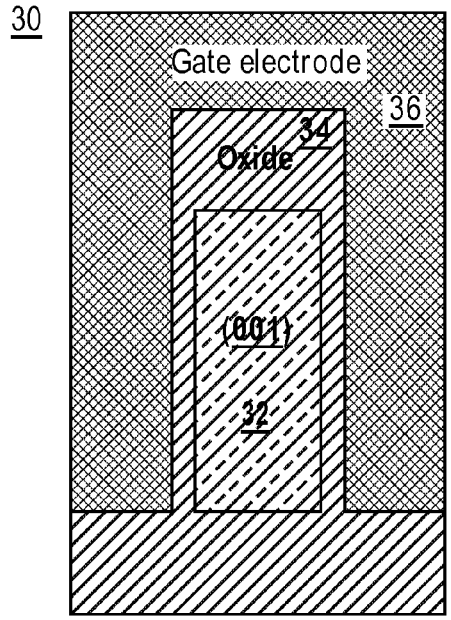
FIGS. 3A and 3B illustrate a further example of the present invention in the context of a FinFET with <110> channels.
Figure 3B:
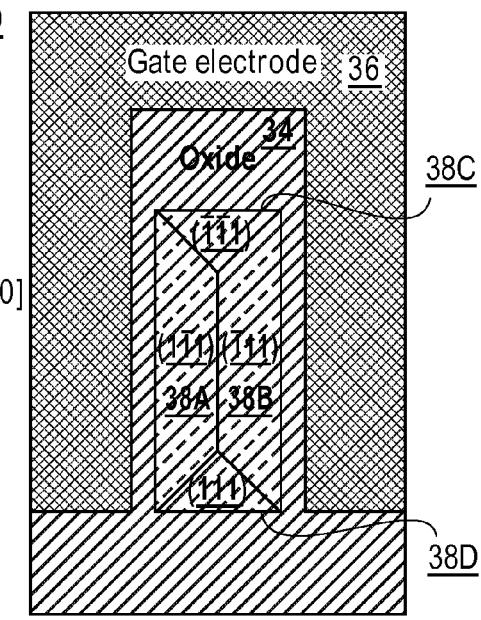

Alternately, if the semiconductor channel originally has a (001) surface exposed at an end, then an etch may reveal (111), (11$\bar{1}$), (1$\bar{1}$1), and (1$\bar{1}\bar{1}$) facets as illustrated in FIG. 3(a) and FIG. 3(b). These surfaces may form one or more notches, or they may form one or more points, or a combination of ridges and points. If a ridge or a point is concave, then depositing a metal on these surfaces may form a convex feature on the metal. This convex metal feature may be advantageous for current flow between a channel and the metal S/D.

A class of devices in which the present invention may be particularly advantageous is a thin-body FET. Examples of thin-body FETs include silicon-on-insulator (SOI) FETs, dual-gate FETs, tri-gate FETs, multi-gate FETs (MuGFETs), FinFETs, Ω-FETs, π-gate FETs, gate-all around FETs (GAA-FETs), nanowire FETs, and nanotube FETs. When combined with a metal source and drain, each of these devices requires the presence of semiconducting material only in the region proximate to the channel, rather than in an extended region encompassing the entire device. With these devices, the cross-sectional area for a source or drain may be relatively small, placing a premium on a relatively low resistance material for the source or drain, making metal, with its substantially lower resistance than that of a doped semiconductor, particularly well suited. Further, these devices facilitate, the formation of well-defined crystallographic facets, in that a semiconductor surface (that proximate to the region of the channel) can be exposed to a wet etch that decorates it with aforementioned facets. For example, for a thin-body FET with transport in the [110] direction, a source may be formed with a silicon (110) face, and a subsequent etch may form (111) and (11$\bar{1}$) surfaces which meet at an angle to allow for the subsequent formation of a convex metal surface.

An alternate orientation of crystal facets may form a convex, as opposed to a concave, semiconductor feature. This would then yield a concave metal feature. Relative to a planar metal surface or a convex metal surface, this orientation may yield a reduced degree of electrostatic coupling between a source and a channel, or between a drain and a channel. Reducing this electrostatic coupling may increase the electrostatic control of the channel by the gate. It is typically a beneficial characteristic of FETs that the electrostatic potential of the channel be primarily controlled by the gate, and less controlled by the source or drain. Thus, this alternate orientation, forming a concave metal S/D, may improve the electrostatic integrity of a transistor.

Whether the preferred shape is a convex, concave or square metal S/D, depends on the particulars of a particular device. For example, if maximizing current through a Schottky barrier is more important to the performance of a particular device, the concave semiconductor surface (convex metal surface) may be preferred. On the other hand, if electrostatic control by the gate is the more important issue, then the convex semiconductor surface (concave metal surface) may be preferred.

Which of the features is formed may depend on where the etch is applied. For example, if the etch is applied from the lateral sidewalls of a narrow Si ridge, a convex semiconductor feature may be formed. On the other hand, if the etch is applied from the center of an exposed (frontal) face of the channel material, a concave semiconductor feature may be formed.

Examples of concave and convex features for a FET device are illustrated in FIGS. 1A (convex S/D) and 1B (concave S/D) in which S/D 10 refers to a metal source or drain, body 12 is a semiconductor (e.g., Si) body (of thickness $t_{si}$) which provides the channel, spacer 16 is an insulating material, preferably resistant to the etch which forms the equivalent lattice planes, and the gate oxide 18 (of thickness $t_{ox}$) is the insulating material between the gates 14A and 14B and the channel(s), also preferably resistant to the etch which forms the equivalent lattice planes. Notice in the illustrations that the result of a concave feature in the Si body is a convex S/D in the metal and the result of a convex feature in the Si body is a concave S/D in the metal. In various embodiments, a single device (e.g., a FET) may have source(s) and/or drain(s) of the same or different shape. For example, a transistor may be formed with a convex metal source and a concave metal drain. Such a configuration may be favorable for minimizing source resistance while at the same time minimizing electrostatic coupling between the drain and the channel. In the illustrated example, the slope of the facets of the metal S/D are given by $\tan\alpha=1/\sqrt{2}$. In one example, gate length L=25 nm, S/D underlap $L_x$=4 nm, $t_{ox}$=1 nm and $t_{si}$=10 nm.

Figure 1B:
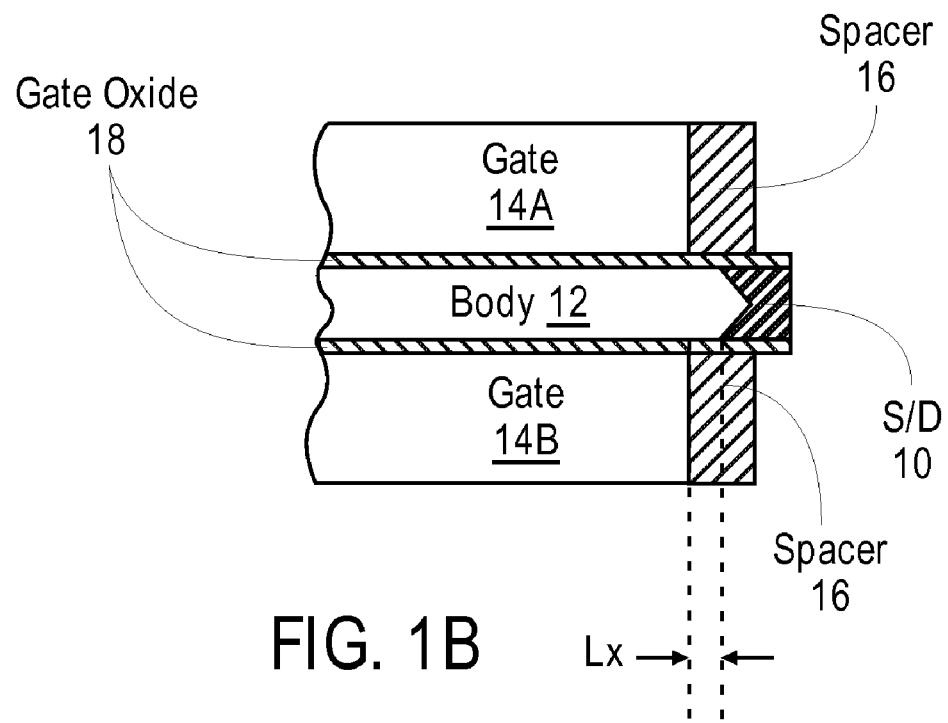

Were the illustrations in FIGS. 1A and 1B to represent FinFETs, the view would be a cross-sectional view from the top. For example, a lateral direction (within the plane of the page) could be [011], the up-down direction (between gates 14A and 14B) could be [100], and a direction perpendicular to the plane of the page could be [01$\bar{1}$]. The illustrations might also represent double-gated FETs, with the two gates oriented one atop the other, rather than the side-by-side configuration of a FinFET.

In addition to the electrostatic advantages, the present invention may offer process control advantages. For example, the crystallographic facets, i.e., the equivalent lattice planes, which are provided by the selective wet etch and are substantially atomically flat (that is to say, they show a substantially reduced number of atomic steps on the surface of said facets), may provide a superior surface for passivation of the S/D-channel interface, for example by heated exposure to a reactive nitrogen species or to hydrogen passivation. In short, one process control advantage is the superior control of the surface chemistry and morphology. Or, the facets may provide superior geometric control relative to a surface etched using more common processes, for example dry etch processes involving appropriate plasmas or energetic ion fluxes. These latter processes may yield a relatively rough surface, providing a relatively poor control of the surface quality and position, whereas the crystallographic facets may provide a greater degree of positional control and uniformity of the tip position, improving the control and uniformity of device behavior. In particular, it would be very difficult to achieve an atomically flat vertical metal S/D to channel interface using the common methods of lithography and dry etch. This is because the precise orientation of the wafer can be controlled only to within about 0.02 degrees on the most advanced lithography tools, and also because a dry etch inherently damages the surface. In contrast, for small geometries as they occur in FinFETs and ultra-thin body SOI FETs, the selective crystallographic wet etch will automatically decorate the surface with fully crystallographic and precisely aligned facets thus improving the geometry over what can be achieved using current tools. As such, the process described here may be described as self-organizing with a high degree of immunity to variability factors introduced by process and equipment fluctuations in manufacturing.

This advantage in control of the source or drain position applies to a doped source or drain as well as a metal source or drain, most specifically when the source or drain is deposited. For example, in the present art it is common for a source or drain to be formed by implanting ionized impurities into the source or drain region, or for a metal source or drain to be formed by chemically reacting a metal with a semiconductor to form a compound. Ion implantations are subject to the random influence of scattering of ions within the semiconductor, while chemical reactions may be difficult to control due to reaction rates which depend on the proximity of interfaces, for example. In the case of the present invention, a source or drain conductor, be that metal, or else a semiconductor deposited along with a sufficient concentration of dopant impurities, may be deposited such that the edge of the source or drain is controlled by the location of the multiple crystallographic facets.

Referring now to FIGS. 2A and 2B, a further example of the present invention in the context of a thin-body, siliconon-insulator. FET 20 is shown. These illustrations show the source end of the device, without the source metal in place. FIG. 2A illustrates salient aspects of the device prior to a crystallographic etch and FIG. 2B illustrates the post-etch condition, exposing {111} facets 28A and 28B. The etch may be performed using a solution of TMAH or KOH or other etch solution well known in the art.

As shown, the thin-body, silicon-on-insulator FET 20 includes a (001) surface with current in the [110] direction. The thin Si 24 is surrounded by a gate oxide 22 with a gate electrode 26 wrapping around the top. The subsequent deposition of a metal will yield a sharp convex feature which will enhance the tunneling of carriers between the metal and the channel formed in the thin silicon layer.

Now turning to FIGS. 3A and 3B, a further example of the present invention in the context of a FinFET with [110] channels is shown. FIG. 3A is a view of the source end of a FinFET 30 looking along the direction from the source to the drain, without the metal in place and prior to the facet etch. A Si (001) surface 32 is exposed. The Si fin is surrounded by a gate electrode 36, with a gate oxide 34 disposed there between. In the figure, the upward direction is [110].

The exposed Si 32 is then etched with a solution of KOH or TMAH or another etch (e.g., $NH_4OH$, NaOH, BTMH, or other amine-based etchant) which exposes {111} surfaces 38A, 38B, 38C and 38D. This results in faceting, shown in FIG. 3B, with a concave surface comprised of four {111} facets. The subsequent deposition of metal will then yield convex features on the metal surface, enhancing the tunneling of carriers between the metal and the channel formed in the silicon.

In various embodiments, the metal that makes up the S/D may be epitaxially aligned with the underlying semiconductor on well-defined crystallographic facets. The metal may be a compound of one or more elements ("metallic elements" or "metallic atoms") and of one or more column IV elements ("semiconductor elements" or "semiconductor atoms"); the ratio of semiconductor atoms to metallic atoms being between 1.5:1 and 2.5:1. By way of example, the metallic elements may be one or more of Co, Ni, Ti, W, Mo, Ta, Pt, Ir, Pd, Ru, Hf, Y, or the rare earth elements. Further, in some cases, a passivation layer epitaxially aligned with underlying semiconductor is interposed between the metal and the semiconductor.

Figure 4A:
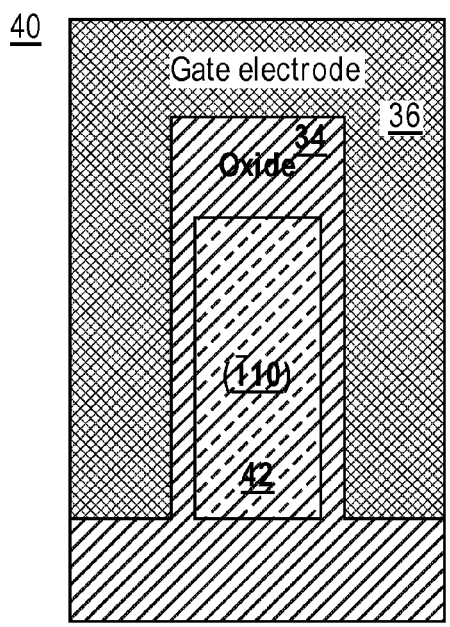
FIGS. 4A and 4B show another FinFET with <100> channels, in this case rotated 45 degrees around the thickness axis relative to the example shown in FIGS. 3A and 3B.
Figure 4B:
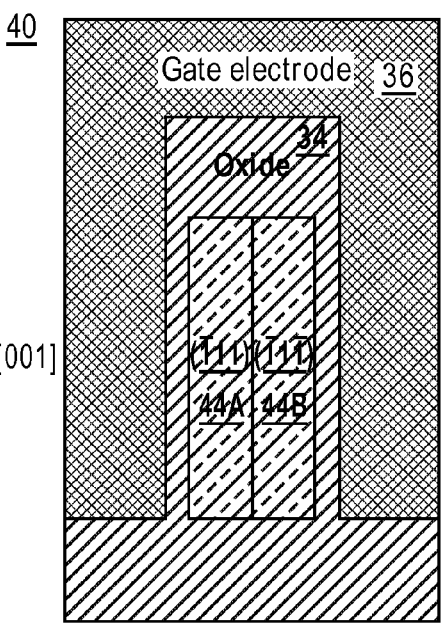
Figures 5A, 5B, 5C:
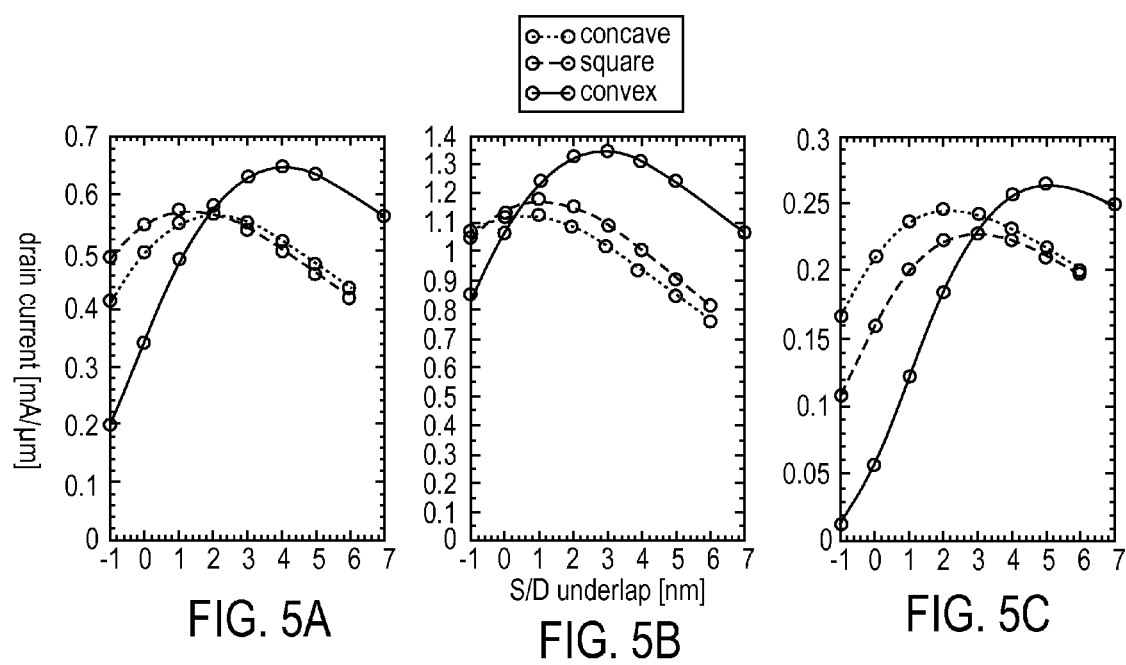
FIGS. 5A-5C are graphs showing simulation results for the dependence of drive current ($I_{Deff}$) on S/D-to-gate underlap ($L_x$) for concave, convex and square S/D-channel interfaces in a FET for a S/D barrier height of 0.1 V.

FIGS. 4A and 4B show another FinFET 40 with [110] channels, in this case rotated 45 degrees relative to the previous example around the <110> axis. In FIG. 4A, a Si ($\bar{1}$10) surface 42 is exposed and the source metal has not yet been deposited. The upward direction in the figure is [110]. The exposed Si is then etched with a solution of KOH or TMAH or another etch which exposes {111} facets/surfaces 44A and 44B. This faceting, shown in FIG. 4B, results in a concave surface made up of two {111} facets. The subsequent deposition of metal will then yield convex features on the metal surface, enhancing the tunneling of carriers between the metal and the channel formed in the silicon.

Embodiments of the present invention thus provide for building a transistor in which the interfaces between channel and S/D regions are more than one crystallographic equivalent lattice plane, resulting in ridge lines or, in some cases, pointed tips. The facets form either an injection point or a knife-edge, that enhances thermionic field emission and thus enables higher than usual dielectric and electrostatic barriers between S/D and channel to achieve a desired device performance. These ridges or pointed tips result in beneficial field enhancements leading to improved electrical properties for the transistor, such as higher drive current at lower voltages.

The crystallographic planes are exposed by decorating a surface that was previously exposed using reactive ion etch (RIE) to a crystallographically sensitive wet etch, which preferentially exposes the family of {111} planes and results in an atomically smooth surface with an easily controlled surface chemistry or surface termination or passivation of dangling bonds. Silicon from the S/D regions is removed using a self-limiting wet etch such as KOH or TMAH, resulting in very high-quality interfaces between the S/D regions and the channel that can subsequently be tailored to have the desired surface morphology, chemistry and electronic properties, before the dielectric and/or the metal deposition.

The geometry of the device is now controlled by gate lithography, width of spacer, and height, width and aspect ratio of the fin. Selection of crystal orientations and wet etch selectivity determines the exposed surfaces and their qualities. Detrimental effects of line edge roughness (LER) resulting from lithography and/or dry etch sidewall roughness may be substantially reduced by the formation of facets in the wet etch step. In particular, the shape of the emission line, its location relative to the gate and transistor channel region are controlled by some or all of these geometric factors. The "outer" edge of these wet-etched planes {111} are defined and substantially self-aligned to the gate spacer and to the lithography feature that defined the S/D regions when they were removed during the RIE step. The self-aligned feature enables a very accurate positioning of the ridge emission line with respect to the gate edge, i.e., the gate-S/D over- or under-lap.

The atomically smooth surface provided by the wet etch is uniquely enabling: In order to build a good Schottky contact at the channel and S/D interfaces, one needs a surface that has the desired and uniform chemical, electro-chemical properties and surface states, so that the growth properties and the electrical characteristics at the interface can be tailored on an atomic scale. In short, a functional de-pinning of the Fermi level at the metal/semiconductor interface is enabled. The use of self-limiting, surface selective etch guarantees or at least enables the surface in question to exhibit the desired chemical, electro-chemical surface states and properties and homogeneity thereof, so that the growth properties and the electrostatic characteristics of a metal-semiconductor junction can be optimized with a low degree of variability in manufacturing. That is, those properties that are occurring on {111} surfaces can now be used for benefit in semiconductor device manufacturing. Similar advantages in process control extend to the manufacturing of doped replacement semiconductor source drain regions.

An example of the advantage of a smooth surface is the provision of a relatively uniform Schottky barrier across the surface. Consider, for example, Tung, Phys. Rev. Let. 52, 461 (1984), J. Vac. Sci. Technol, B 2, 465 (1984), indicating that the Schottky barrier of a metal, the specific example being NiSi, depends on the local crystallographic orientation. Furthermore, he describes (Phys. Rev. Let. 66, 72 (1991)) how a non-uniform Schottky barrier height is detrimental to the characteristics of a metal-semiconductor junction. Therefore, the use of a selective wet etch to decorate a previously etched surface in such a way as to expose facets that are substantially made of one single atomic plane leads to latterly homogeneous Schottky barriers across the facets. To reiterate, these facets exhibit a greatly reduced area density of surface imperfections such as atomic layer steps or islands and therefore the use of the selective crystallographic wet etch results in superior Schottky barriers.

Additionally, providing crystallographic surfaces of a given orientation provides for the possibility of the formation of epitaxial layers on these surfaces. For example, many metals may be formed epitaxially on Si {111} surfaces. These epitaxial metal-semiconductor junctions may provide for reduced interface state densities and for reduced variability relative to metals formed non-epitaxially. Furthermore, it may be beneficial to form epitaxial passivation layers on pure crystallographic surfaces. For example, epitaxial β-Si$_3$N$_4$ may be formed on Si {111} surfaces. Such surfaces may additionally be advantageous for the epitaxy of an in-situ doped semiconductor source or drain, for example Ge—Si alloy on Si.

Aligning the wafer in such a way that the wafer normal is a (001) surface, and that the fin is aligned parallel to the [110] axis, and then exposing the (1$\bar{1}$0) surface to a KOH or TMAH etch results in a horizontal ridge line. If this is not desired, the wafer will have to be selected with a surface orientation rotated by 90 degrees so that [110] is normal to wafer surface, the (001) plane becomes a sidewall of the channel (gate oxide), and that (1$\bar{1}$0) is the front and ($\bar{1}$10) is the back wall of the fin, to achieve the desired vertical ridge line. Of course, this is only an example and many other embodiments can be envisioned and realized.

Device simulations have been performed using Synopsys™ DESSIS™ version 10 to illustrate the benefits of the invention in terms of improvements in electrical performance of field effect transistors. Metal source, drain, and gate were modeled by their surfaces, which enforce an effective work function for that metal. In the Si body, the density gradient method was applied to both electrons and holes, with drift-diffusion transport using calibrated velocity saturation. Metal-semiconductor transport was treated with the WKB-based model of Leong et al., using tunneling effective masses of 0.19 (electrons) and 0.16 (holes). The threshold voltage was set using a metal gate work function to establish an off-current target 100 nA/μm at $V_G$=0 and $V_D$=1 V for a subnominal L=L$_{sub}$=22 nm FET, then drive current was determined at a supernominal L=L$_{sup}$=28 nm, where, $V_G$ is the gate bias, $V_D$ is the drain bias and L is the gate length. Drive current (I$_{Deff}$) was established using the logarithmic form of results reported by Na et al., with $V_{DD}$=1 V. A typical gate-to-drain capacitance (C$_{GD}$) was then extracted using a low frequency (1 kHz) alternating current simulation with all nodes at 0 V with a nominal L=L$_{nom}$=25 nm. Structures were generated using Synopsis/ISE Mesh™ v.10. Half of the dual gate structure was generated (half of the source, drain and body, with one of the two gates) with reflective boundary conditions along the symmetry axis. Thus, the currents presented in the following charts are per unit gate width, which is twice the device width in a dual-gate FET.

For simulations concerning structures similar to that shown in FIGS. 1A and 1B, FIGS. 5A-5C are charts illustrating the L$_x$-dependence of the following estimation of effective switching current [Na, et al., 2002 IEEE IEDM Tech. Digest, pp. 121-124] for each device, with a S/D $\Phi_B$=0.1 V:

$$I_{Deff}=(I_{Deff1}-I_{Deff2})/\ln|I_{Deff1}/I_{Deff2}|$$

In these charts: The graphs show I$_{Deff}$ (FIG. 5A) as well as the components of I$_{Deff}$ separately, the greater (I$_{Deff1}$—FIG. 5B) at a higher gate bias ($V_G$=1V) and lower drain bias ($V_D$=0.5 V), and the lesser (I$_{Deff2}$—FIG. 5C) at a lower gate bias ($V_G$=0.5 V) and higher drain bias ($V_D$=1 V). Curves are shown for three different S/D shapes: concave, convex and square metal.

The illustrations show that the concave metal shape, with a suitably larger underlap to reduce drain-to-channel electrostatic coupling, exhibits the best result. I$_{Deff2}$ is more sensitive to short-channel effects, and therefore is maximized for a greater L$_x$. It is in this component that the concave S/D offers a benefit versus a square S/D, and the advantage of the convex S/D is relatively less.

Figure 6:
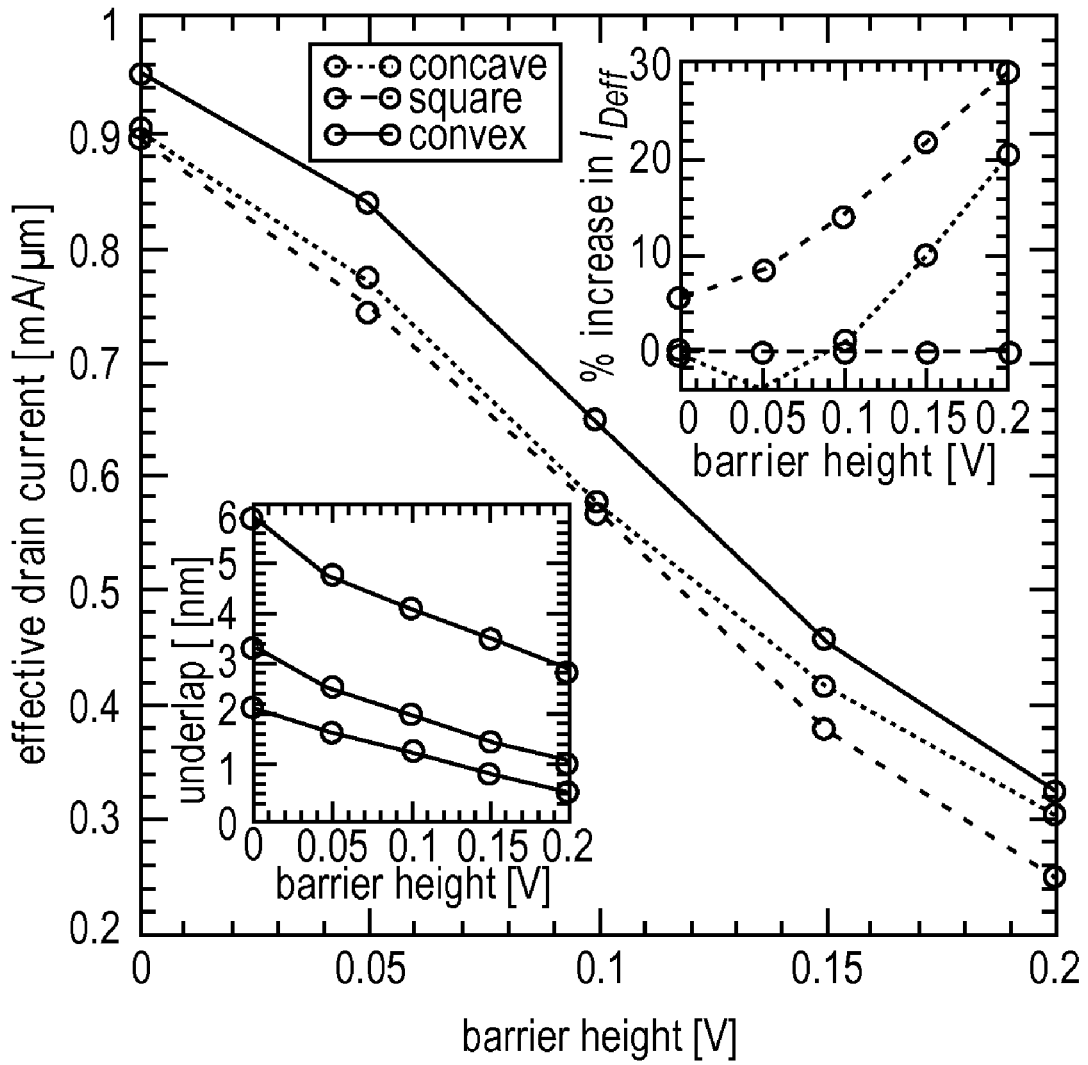
FIG. 6 is a graph showing simulation results for dependence of drive current ($I_{Deff}$) on S/D barrier height ($\Phi_B$) for each S/D type (concave, convex and square) for a S/D barrier with $L_x$ optimized (the inset graph on the left shows the optimized $L_x$ and the inset graph on the right shows the percent improvement relative to a square S/D)

For each $\Phi_B$ and S/D shape, L$_x$ was optimized to maximize I$_{Deff}$, which was interpolated to second order (shown in FIG. 6). The effective drain current is plotted in the main graph, while the optimized L$_x$ and the relative improvement in I$_{Deff}$ versus a square shape are plotted in insets. The convex shape exhibits an advantage across the entire range. At higher $\Phi_B$ the need to enhance thermionic field emission with electric fields from the gate is increased, reducing the optimal L$_x$. Additionally, higher $\Phi_B$ increases the benefit of enhanced thermionic field emission, increasing the benefit of the convex shape. The advantage of the convex shape is also increased, as the lower L$_x$ required for sufficient electric fields increases the importance of short channel effects.

Figures 7A, 7B, 7C:
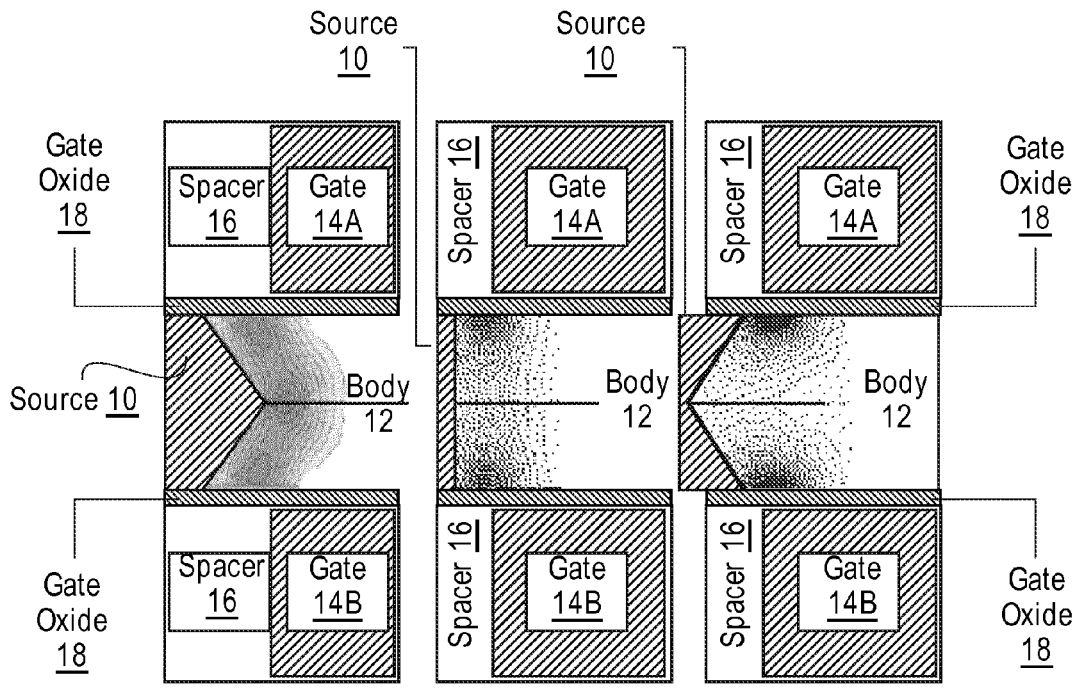
FIGS. 7A-7C are cross-sectional plots showing rates of carrier emission from the source into Si conduction bands at a Na et al. bias condition ($V_D=V_{DD}$, $V_G=V_{DD}/2$, with $V_{DD}=1$ V) for each of the three source geometries.

The advantage of the convex source is illustrated in FIGS. 7A-7C (which adopt the labeling conventions of FIGS. 1A and 1B), which show simulated patterns of carrier tunneling into conduction bands for each of the three geometries. More specifically, FIGS. 7A-7C are cross-sectional plots of the rate of carrier emission from the source into the Si conduction band at a bias condition ($V_D$=$V_{DD}$, $V_G$=$V_{DD}$/2, with $V_{DD}$=1 V) for each of the three source geometries: FIG. 7A shows a convex S/D with L$_x$=4 nm, FIG. 7B shows a square S/D with L$_x$=2 nm, FIG. 7C shows a concave S/D with L$_x$=1 nm. For each simulation, L$_x$ has been set to the nearest nanometer to the optimal I$_{Deff}$.

In each case, as evident from these illustrations, there is an emission peak at the channel near the gate corner. For the convex source emission enhancement yields a third peak at the ridge-line. Some of this advantage has been traded for the short channel effect advantage of a larger L$_x$.

Figures 8A, 8B:
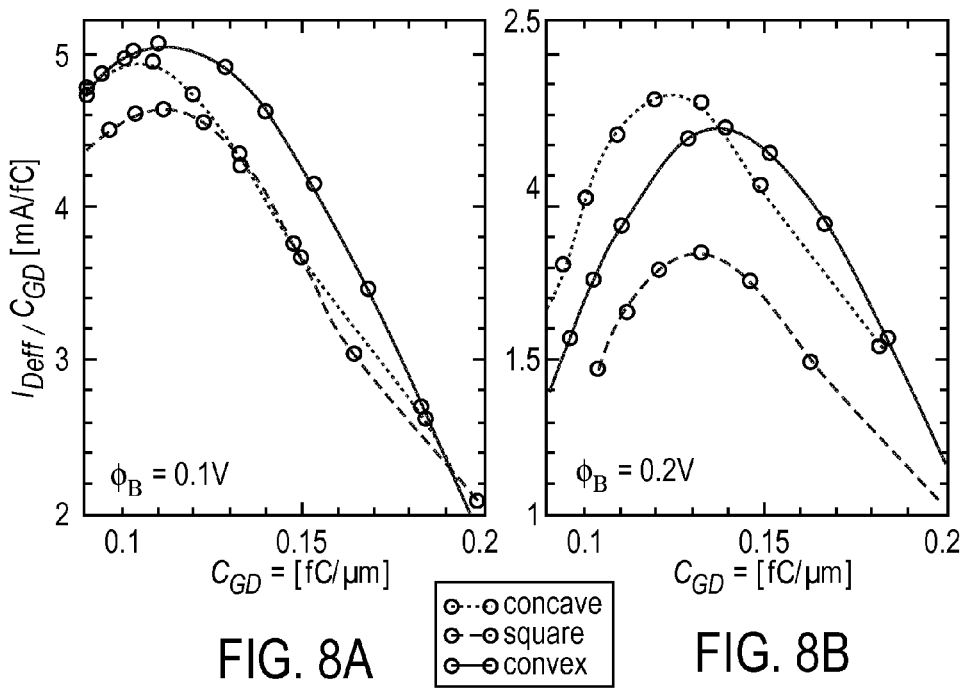
FIGS. 8A and 8B show $I_{Deff}/C_{GD}$ plotted versus $C_{GD}$ as $L_x$ is varied for each of the S/D designs with $\Phi_B=0.1$ V (FIG. 8A) and $\Phi_B=0.2$ V (FIG. 8B)

A principal issue with S/D design and optimization is fringe capacitance. To evaluate this, C$_{GD}$ was determined as described above. FIGS. 8A and 8B show I$_{Deff}$/C$_{GD}$ plotted versus C$_{GD}$ as L$_x$ is varied for each of the S/D designs with $\Phi_B$=0.1 V (FIG. 8A) and $\Phi_B$=0.2V (FIG. 8B). Both the concave and convex S/D designs do better than the square S/D for each considered $\Phi_B$. However, with the added importance of short-channel effects at the higher $\Phi_B$=0.2 V, the concave S/D is the best, while the convex tip demonstrates a small advantage at the lower $\Phi_B$=0.1 V.

Figure 9:
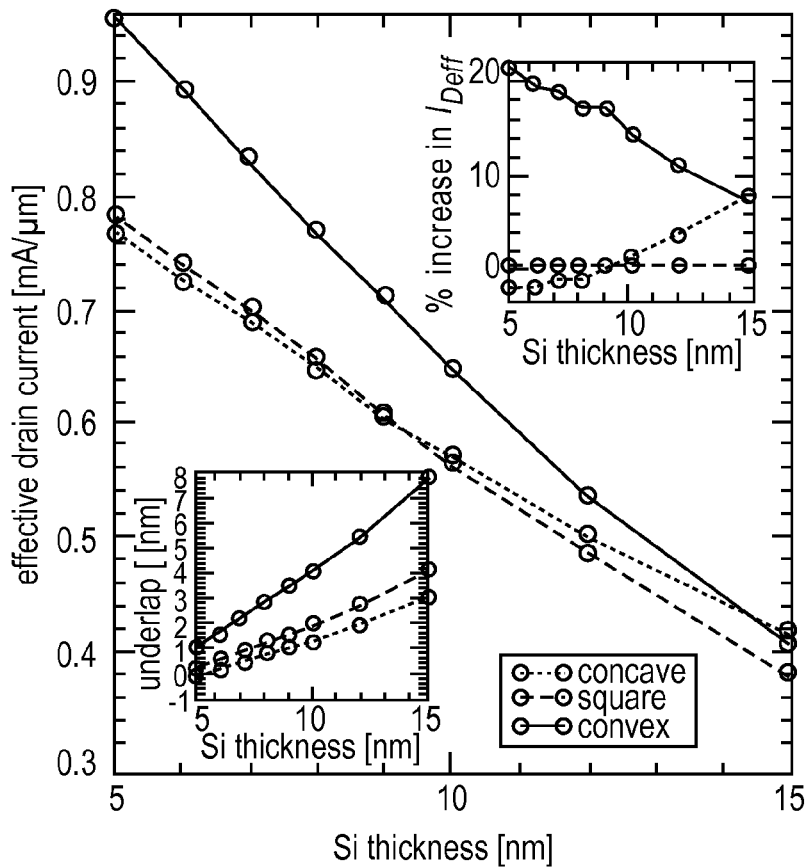
FIG. 9 is a graph illustrating simulated dependence of drive current ($I_{Deff}$) on body thickness ($t_{Si}$) for each S/D type for $\Phi_{SD}=0.1$ V with $L_x$ optimized.
Figure 10:
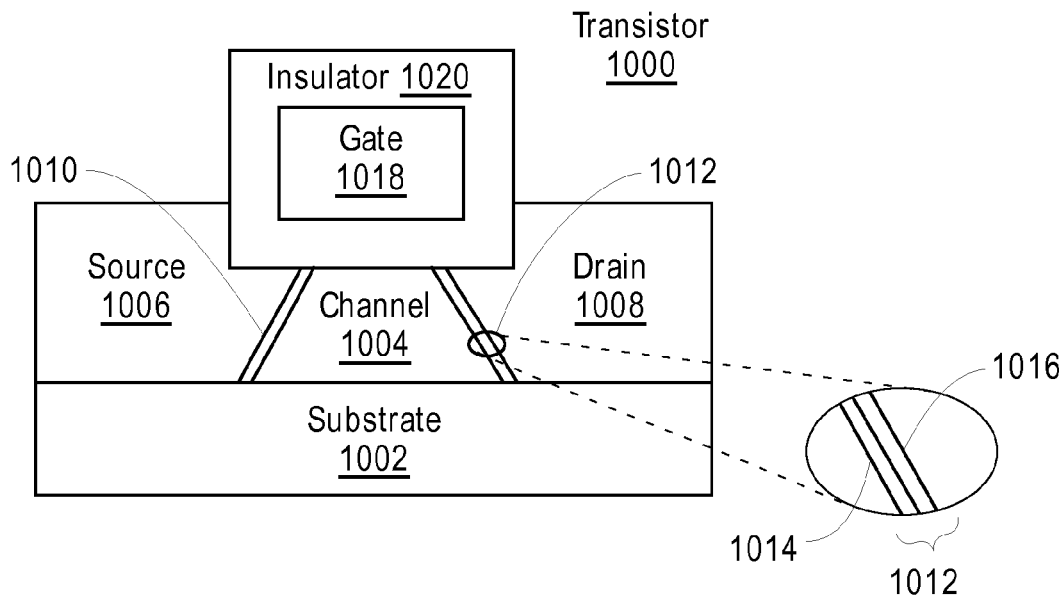
FIG. 10 is a reproduction of FIG. 2 of commonly-owned U.S. Pat. No. 6,833,556.
Figure 11:
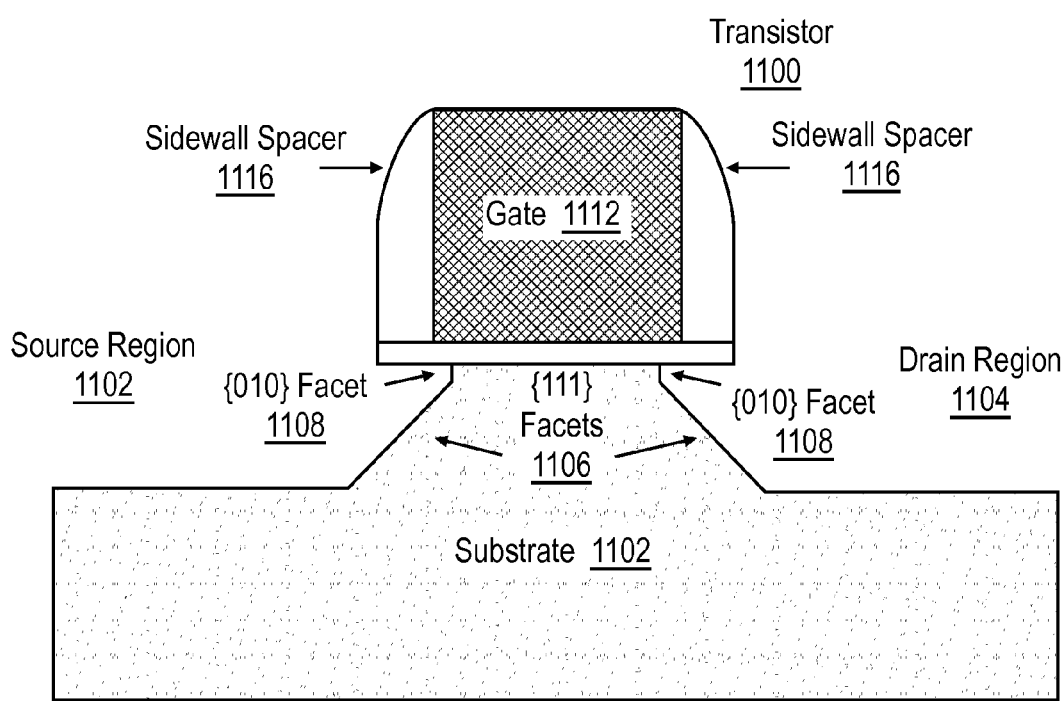
FIG. 11 is a reproduction of FIG. 2 of U.S. Pat. No. 7,494,858.

FIG. 9 is a graph showing the effect of Si (body) thickness (t$_{Si}$) with $\Phi_B$=0.1 V. For each value of t$_{Si}$ and for each S/D shape, L$_x$ was set to maximize I$_{Deff}$. The advantage of the convex S/D is greater for thinner Si, while the advantage of the concave S/D is greater for thicker Si. For thicker Si, there is a premium on reducing short-channel effects, which mandates a relatively large L$_x$, reducing the magnitude of electric fields to be magnified by the tip, increasing the importance of the short-channel effect advantage of the concave shape. For thinner Si, benefits in short-channel effects are less important, and the advantage of electric field magnification is greater, boosting the advantage of the convex S/D. Thinner Si allows for less underlap, and for closer proximity of the tip to the channel and to the gate, increasing the electric field magnitude.

In FIG. 9, the main graph illustrates simulated dependence of drive current (I$_{Deff}$) on body thickness (t$_{Si}$) for each S/D type for $\Phi_{SD}$=0.1 V with L$_x$ optimized. The left inset shows the optimized L$_x$, and the right inset shows the percent improvement relative to the square S/D shape.

These results indicate that, considering short channel effects, the use of multiple crystallographic facets applied to a metal source and drain can yield substantial performance improvements relative to a single-facet source and drain. It can be inferred these advantages would further apply relative to a roughly etched source and drain. In the case of a comparison to a roughly etched surface, the potential advantages of crystallographic facets in terms of greater process control, reduced variability and improved surface quality already described also apply.

Thus, metal S/D FETs in which a surface of a semiconductor channel proximate to the metal S/D is formed of two or more well-defined crystallographic surfaces from the same family of equivalent lattice planes (i.e., sharing a common orientation) that meet at an angle such that a surface of the metal S/D proximate to the semiconductor channel forms an angled feature have been described.

The foregoing description, however, is not intended to limit the present invention. For example, while the line segment along (or point at) which the angled facets meet may, in some embodiments, be aligned with the proximate location/extent of the channel inversion layer, in other embodiments of the invention the line segment along (or point at) which the angled facets meet may be several nanometers from the channel inversion layer.

Further, although the focus of the above discussion has been metal S/D FETs, the present invention may also be applicable to the class of doped semiconductor S/D FETs as well where the doped S/D regions are deposited or grown (replacement S/D) and where the line segment along (or point at) which the angled facets meet is aligned with the proximate location/extent of the channel inversion layer. Analogous to the case of a metal S/D-semiconductor channel FET, doped S/D FETs will also benefit from an enhanced field emission that is facilitated by the angled feature, as a field will form between the generally differently doped channel and the S/D semiconductor material. We also observe that the location of the doped S/D region may be better controlled by the replacement S/D method than it is by the formation of the doped S/D regions by means of ion implantation.

In addition to the techniques discussed above, crystallographic-sensitive etches may be used for II-VI semiconductor materials as well. For example, plasma etching with $CH_3$ methyl radicals can yield etch facets in CdTe.

Moreover, the present invention may be used in the context of a bulk transistor: After forming a gate and spacer stack for conventional bulk transistors, the S/D regions are etched using a directional reactive ion plasma etch to a prescribed depth. Thereafter, an insulating layer, i.e., a dielectric, may be formed at the bottom of the S/D regions, e.g., by use of a directional plasma assisted oxidation of silicon or other directional methods in other materials. This dielectric serves several purposes: It electrically insulates the source and the drain from the bulk substrate and it is also resistant to the wet etch that is used to form the facets, i.e., it etches substantially slower than the channel material. After formation of the insulating layer, the sidewall of the S/D regions that are adjacent to the channel are subjected to an etch process that forms the angled facets on those sidewalls. As a practical matter, one could use a nitride spacer on the S/D sidewalls during the plasma oxidation of the bottom surface, so that these sidewalls are protected from the oxidation, and the plasma oxidation can be tuned to undercut the spacer and thus adjust the extent to which the facet etch can progress laterally. The thus formed S/D region may now be filled with either a metal as a S/D material or with a doped semiconductor of the same or a different kind than the channel material. The facets may be passivated by a thin layer just thick enough to passivate the dangling bonds at the surface.

Accordingly, the foregoing description should not be read as limiting the present invention, which is better defined in the following claims.

What is claimed is:

1. A field effect transistor (FET) comprising a metal source and/or drain (S/D) and a semiconductor channel, wherein a surface of the semiconductor forming the interface between the metal S/D and the channel is formed of two or more well-defined crystallographic facets of a same family of equivalent lattice planes, said facets meeting at an angle with respect to one another such that a surface of the metal S/D proximate to and in direct contact with the semiconductor channel forms an angled feature and a line segment.

2. The FET of claim 1, wherein the two or more well-defined crystallographic facets form a convex feature in the semiconductor, such that the surface of the metal S/D proximate to the semiconductor channel forms a concave feature.

3. The FET of claim 2, wherein relative control of a potential of the semiconductor channel by a gate is greater than would be provided in the absence of the concave feature.

4. The FET of claim 1, wherein the two or more well-defined crystallographic facets form a concave feature in the semiconductor, such that the surface of the metal S/D proximate to the semiconductor channel forms a convex feature.

5. The FET of claim 4, wherein the convex feature in the metal S/D enhances current flow between the S/D and the semiconductor channel relative to a current flow which would occur in the absence of the convex feature.

6. The FET of claim 1, wherein the semiconductor channel proximate to the metal S/D is primarily a single crystal semiconductor.

7. The FET of claim 6, wherein the well-defined crystallographic surfaces comprise two or more {111} surfaces.

8. The FET of claim 7, wherein the semiconductor channel is primarily silicon.

9. The FET of claim 8, wherein the well-defined crystallographic facets are formed, in part, using an etch with a potassium hydroxide solution.

10. The FET of claim 8, wherein the well-defined crystallographic facets are formed, in part, using an etch with a tetramethylammonium hydroxide solution.

11. The FET of claim 6, wherein the semiconductor is a compound semiconductor, and the facets are formed on {110} surfaces meeting at a right angle, and where the intersection of two facets forms a line segment parallel to a {100} channel surface plane.

12. The FET of claim 11, wherein the semiconductor is primarily a III-V semiconductor.

13. The FET of claim 11, wherein the semiconductor is primarily a II-VI semiconductor.

14. The FET of claim 1, wherein the metal comprising the S/D is epitaxially aligned with the underlying semiconductor on well defined crystallographic facets.

15. The FET of claim 14, wherein the metal comprises a compound of one or more elements ("metallic elements" or "metallic atoms") and of one or more column IV elements ("semiconductor elements" or "semiconductor atoms").

16. The FET of claim 15, wherein a ratio of semiconductor atoms to metallic atoms is between 1.5:1 and 2.5:1.

17. The FET of claim 16, wherein the metallic elements comprise one or more of Co, Ni, Ti, W, Mo, Ta, Pt, Ir, Pd, Ru, Hf, Y, or the rare earth elements.

18. The FET of claim 1, wherein said facets meet proximate an inversion layer in the channel.

19. The FET of claim 1, wherein between the metal and semiconductor a passivation layer epitaxially aligned with underlying semiconductor is interposed.

20. The FET of claim 1, wherein the FET is a thin-body FET in which all semiconductor material proximate to the metal S/D is also proximate to the semiconductor channel.

21. The FET of claim 1, wherein a thickness of the semiconductor is less than its width, a thickness direction is along a [001] crystallographic orientation, a width direction is along a [$\bar{1}$10] crystallographic orientation, and a direction between a source and drain perpendicular to the width direction and perpendicular to the thickness direction is a [110] crystallographic orientation.

22. The FET of claim 1, wherein a thickness of the semiconductor is less than its width, a thickness direction is along a [001] crystallographic orientation, a width direction is along a [010] crystallographic orientation, and a direction between a source and drain perpendicular to the width direction and perpendicular to the thickness direction is a [100] crystallographic orientation.

23. The FET of claim 1, wherein a thickness direction is along a [110] crystallographic orientation, a width direction is along a [1 $\bar{1}$0] crystallographic orientation, and a direction between a source and drain perpendicular to the width direction and perpendicular to the thickness direction is a [001] crystallographic orientation.

24. The FET of claim 1, wherein a thickness direction is along a [110] crystallographic orientation, a width direction is along a [001] crystallographic orientation, and a direction between a source and drain perpendicular to the width direction and perpendicular to the thickness direction is a [$\bar{1}$10] crystallographic orientation.

25. The FET of claim 1, wherein the semiconductor is primarily a semiconductor.

26. The FET of claim 25, wherein the facets are etched using a plasma of a halide.

27. The FET of claim 1, wherein the semiconductor is primarily a II-VI semiconductor.

28. The FET of claim 1, wherein the well-defined crystallographic facets form a line segment and where the metal S/D-semiconductor junction formed at the facets and the line segment is smoother and better controlled or its position is better controlled than the junction would be in the absence of a crystalographically selective etch.

29. The FET of claim 1, wherein the well-defined crystallographic facets are formed by a crystallographic etch that exposes substantially atomically flat surfaces which facilitate the formation of a latterly more homogeneous Schottky barrier than would be formed without the use of the crystallographic etch.

30. A field effect transistor (FET) comprising a metal source and/or drain (S/D), a semiconductor channel in direct contact with a thin passivation layer between the metal S/D and the semiconductor channel, wherein a surface of the semiconductor forming the interface between the passivation layer and the channel is formed of two or more well-defined crystallographic facets of a same family of equivalent lattice planes, said facets meeting at an angle with respect to one another such that a surface of the passivation layer proximate to and in direct contact with the semiconductor channel forms an angled feature and a line segment.

31. A field effect transistor (FET) comprising a metal source and/or drain (S/D) and a semiconductor channel, wherein a surface of the semiconductor forming the interface between the S/D and the channel is formed of two or more well-defined crystallographic facets of a same family of equivalent lattice planes, said facets meeting at an angle with respect to one another such that a surface of the S/D proximate to and directly contacting the semiconductor channel forms an angled feature and a line segment, said angled feature and line segment being proximate a location of an inversion layer in the channel.

32. A method, comprising:
following formation of a gate and spacer stack for a transistor, etching source and/or drain (S/D) region(s) of the transistor using a directional reactive ion plasma etch;
forming an insulating layer at a bottom of the S/D region(s);
etching a sidewall of the S/D region(s) that is/are adjacent to a channel region of the transistor to form two or more well-defined crystallographic facets of the same orientation on the sidewall, said facets meeting at an angle with respect to one another such that the S/D region proximate to and directly contacting the channel region extends to form an angled feature and a line segment, said angled feature and line segment being proximate a location of an inversion layer in the channel; and
depositing a metal in the S/D region to form a metal S/D.

* * * * *